United States Patent [19]

Bour et al.

[11] Patent Number: 5,003,548
[45] Date of Patent: Mar. 26, 1991

[54] HIGH POWER (1, 4 W) ALGAINP GRADED-INDEX SEPARATE CONFINEMENT HETEROSTRUCTURE VISIBLE (λ-658 NM) LASER

[75] Inventors: David P. Bour, Robbinsville, N.J.; James R. Shealy, Ithaca, N.Y.

[73] Assignee: Cornell Research Foundation, Inc., Ithaca, N.Y.

[21] Appl. No.: 247,206

[22] Filed: Sep. 21, 1988

[51] Int. Cl.$^5$ .............................................. H01S 3/19
[52] U.S. Cl. ........................................ 372/44; 372/45
[58] Field of Search .................................... 372/44, 45

[56] References Cited

U.S. PATENT DOCUMENTS

| | | | |
|---|---|---|---|
| 4,494,237 | 1/1985 | Di Forte Poisson et al. | 372/45 |
| 4,546,480 | 10/1985 | Burnham et al. | 372/45 |
| 4,599,728 | 7/1986 | Alavi et al. | 372/45 |
| 4,635,268 | 1/1987 | Motegi et al. | 327/45 |
| 4,644,553 | 2/1987 | VanRuyven et al. | 372/45 |
| 4,680,768 | 7/1987 | Yagi | 372/45 |

FOREIGN PATENT DOCUMENTS 59-184583 10/1984 Japan.

OTHER PUBLICATIONS

Ikeda, M. et al, Appl. Phys. Lett., 47:1027 (1985).
Ishikawa, M. et al, Appl. Phys. Lett., 48:207 (1986).
Kobayashi, K. et al, Electron. Lett., 21:931 (1985).
Ishikawa, M. et al, Extended Abstracts of the 18th (1986 International) Conference on Solid State Devices & Materials, Tokyo, 1986 (Komiyama, Japan 1986) pp. 153–156.
Ikeda, M. et al, Apply. Phys. Lett., 50:1033 (1987).
Tanaka, H. et al, J. Appl. Phys., 61:1713 (1987).
Tsang, W. T., Appl. Phys. Lett., 39:134 (1981).
Nagle, J. et al, Appl. Phys. Lett., 50:1325 (1986).
Honda, M. et al, Jpn. J. Appl. Physics, 24:3, L187–189 (1985).
Gomyo, A. et al, Appl. Phys. Lett., 50:673 (1987).
Dutta, N. K., J. Appl. Phys., 54:1236 (1983).
Tihanyi, P. et al, Appl. Phys. Lett., 50(23) Jun. 8 (1987).
Horikoshi, Y. et al, appl. Phys. Lett., 50(23):1686–1687 (1987).
NE Report, Japanese BiWeekly Magazine Report, Applied Physics Letters, vol. 51, No. 21, pp. 1658–1660, Nov. 23, 1987.
Shealy, J. R., Appl. Phys. Lett., 52(18) May 2 (1988).
Shealy, J. R., Appl. Phys. Lett., 50(23) Jun. 8 (1987).
Bour, D. P. et al, Appl. Phys. Lett., 51(21) Nov. 23 (1987).

*Primary Examiner*—William L. Sikes
*Assistant Examiner*—Robert E. Wise
*Attorney, Agent, or Firm*—Jones, Tullar & Cooper

[57] ABSTRACT

Single quantum well short wavelength AlGaInP GRIN-SCH semiconductor lasers having high output power in the 660–680 nm range were prepared by organometallic vapor phase epitaxy. The laser active region preferably consists of a 100 Å single $Ga_{0.5}In_{0.5}P$ quantum well and 1600 Å graded index regions on both sides of the well. The graded index regions were produced by lattice-matched graded composition $(Al_yGa_{1-y})_{0.5}In_{0.5}P$ quaternary alloys where y has a value from about 0.2 to 0.6. This structure reduces the broad-area threshold current compared to a double heterostructure laser to give pulsed thresholds as low as 1050 A/cm². Total pulsed power of 1.4 W at 658 nm is available from an 80 μm×300 μm mesa-stripe laser. A differential quantum efficiency of up to about ~56% was measured. Indicated uses include diode-pumped solid state laser applications and as a light source in optical disk drives and holographic scanners.

18 Claims, 5 Drawing Sheets

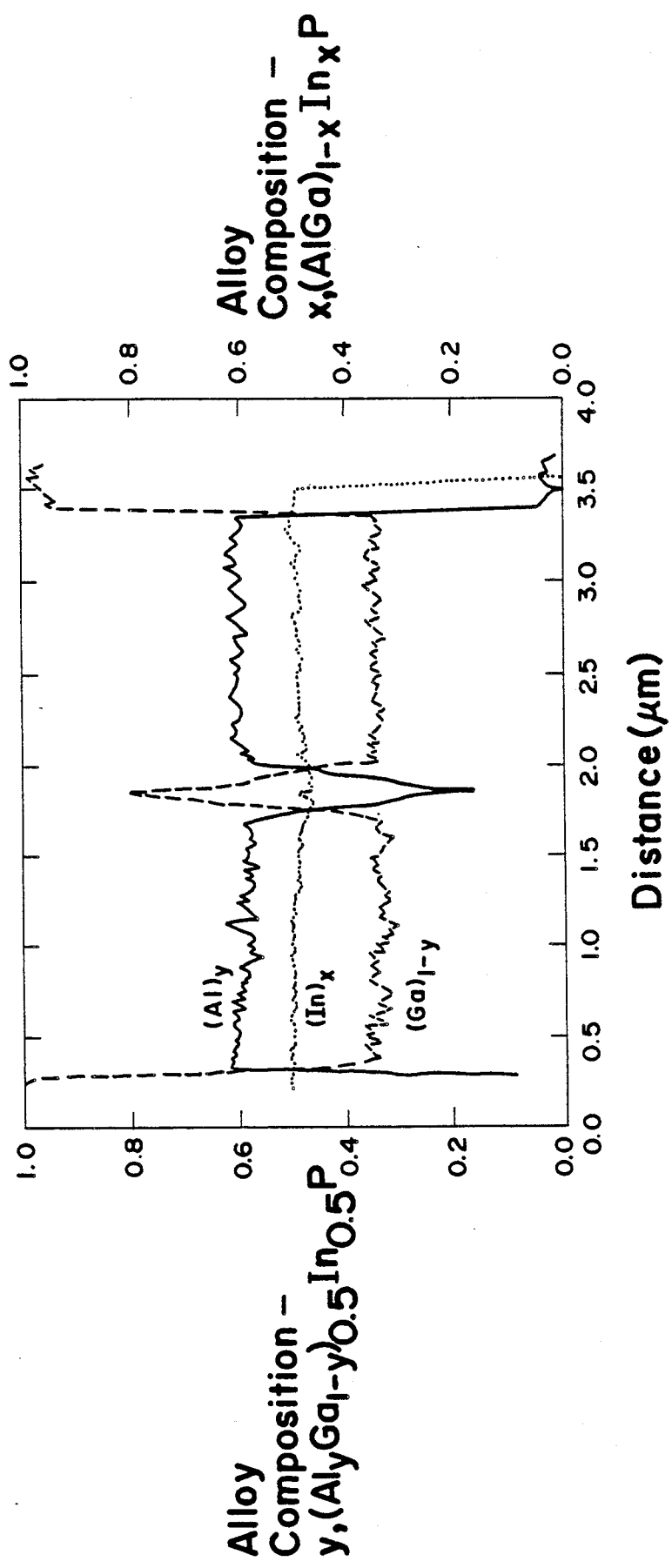

HIGH POWER (1, 4 W) ALGAINP GRADED-INDEX SEPARATE CONFINEMENT HETEROSTRUCTURE VISIBLE (λ-658 NM) LASER

This invention was made in part under AFOSR Contract No. F49620-84-C-0060 and ONR Contract No. N0014-86-K-0531. The United States has certain rights to this invention.

The present invention relates to single quantum well AlGaInP semiconductors and to graded-index separate confinement heterostructure lasers capable of operating at high pulsed power and high differential quantum efficiency. The new materials are particularly advantageous in providing high performance visible laser diodes and as a light source in optical disk drives, holographic scanners and compact disk players.

BACKGROUND OF THE INVENTION

The $(Al_yGa_{1-y})_{0.5}P$ materials system lattice matched to GaAs substrates is an attractive material for the realization of high performance visible laser diodes. Room temperature cw operation of double heterostructure (DH) laser diodes has been reported by M. Ikeda et al, *Appl. Phys. Lett.*, 47:1027 (1985); by M. Ishikawa et al, *Appl. Phys. Lett.* 48:207 (1986); and by K. Kobayashi et al, *Electron. Lett.* 21:931 (1985). To date, DH lasers have shown the lowest threshold current densities, with the best reported value of 1.7 kA/cm² for a structure with $Al_{0.5}In_{0.5}P$ cladding layer (cf M. Ishihawa et al. Extended Abstracts of the 18th (1986 International) Conference on Solid State Devices and Materials. Tokyo. 1986 (Komiyama. Japan. 1986), pp. 153–156)).

However, most laser results have been achieved with quaternary $(Al_yGa_{1-y})_{0.5}P$ cladding layers which reduce optical confinement but are required to overcome the difficulty of obtaining low-resistivity p-type layers using zinc dopant. The best broad-area laser threshold current densities for structures with quaternary cladding layers are about 3.5 kA/cm² (Ishikawa et al, *Appl. Phys. Lett.*, 48:207 (1986) and M. Ikeda et al, *Appl. Phys. Lett.*, 50:1033 (1987)). Efforts to reduce threshold current have included multiquantum well structures which have reduced lasing wavelength but have not had the desired effect of reducing threshold current (of W. T. Tsang, *Phys. Lett.*, 39:134 (1981) and H. Tanaka et al, *J. Appl. Phys.*, 61 1713 (1987)). The present invention provides a unique structure with a single quantum well (QW) active region and separate optical confinement region with enhanced performance.

The new materials represent the first operation of an AlGaInP laser with a single active quantum well and are an advance over double heterostructure (DH) lasers. Using the new material (AlGaInP), high-power results are obtained for both DH and GRIN-SCH laser structures.

BRIEF SUMMARY OF THE INVENTION

One object of the present invention relates to an improved visible light (red) laser having a power efficiency greater than 30% and a low threshold current density.

Another object of the present invention relates to single quantum well short wavelength AlGaInP GRIN-SCH semiconductor lasers having high output power in the 660–680 nm range where the laser active region comprises a single 100 Å $Ga_{0.5}In_{0.5}P$ quantum well and 1600 Å graded index regions on both sides of the well, said graded index regions produced by lattice-matched graded composition $(Al_yGa_{1-y})_{0.5}In_{0.5}P$ quaternary alloys wherein y is a value greater than zero but less than one and preferrably a value from about 0.2 to about 0.6. Said lasers have pulsed thresholds as low as 1050 Å/cm², total pulsed power of 1.4W at 658 nm using a 80 μm×300 μm mesa-stripe laser, and a differential quantum efficiency of about 50%.

Another object of the present invention is a laser that lases in the visible region range from about 650 nm to about 680 nm which comprises: (1) a GaAs substrate (2) an active layer comprising a single $Ga_xIn_{(1-x)}P$ quantum well where x is a value greater than zero and less than 1.0 and prferrably $Ga_{0.5}In_{0.5}P$, and having a thickness from about 40 Å to about 200 Å and preferrably about 100 Å, said single quantum well being situated between multiple graded index regions (GRIN) 3) multiple GRIN regions surrounding the quantum well comprising a first undoped graded index region situated on the substrate side of the quantum well adjacent to a p-cladding layer and a second undoped graded index region situated on the opposite side of the quantum well; wherein said graded index regions comprise a lattice material quaternary AlGaInP and are graded from $(Al_{0.6}Ga_{0.4})_{0.5}In_{0.5}P$ to $(Al_{0.2}Ga_{0.8})_{0.5}In_{0.5}P$ 4) cladding layers surrounding the GRIN regions comprising a p-cladding layer adjacent to the first index region comprising dopped $(Al_{0.6}Ga_{0.6})_{0.5}In_{0.5}P$ 5) a capping layer situated on top of the n-type (n~5×10¹⁸cm⁻³) $Ga_{0.5}In_{0.5}P$ capping layer situated on the n-cladding layer 6) a p-type (p~5×10¹⁸cm⁻³) $Ga_{0.5}In_{0.5}P$ buffer layer situated between the substrate and the p-type cladding layer where the layers are deposited epitaxially; items (1) and (2) are deposited at 650° C. and the remaining layers were deposited at 700° C.; the epitaxial layers were prepared by low pressure (76 torr) organometallic vapor phase epitaxy (OMVPE) using trimethyl metals and phosphine; the cladding layers and graded regions were grown at a rate of 400 Å/min with a Group V/Group III ratio of 300; the capping layer was grown at 200 Å/min with Group V/Group III ratio about 600 and a 30-s stop was included at the quantum well interface.

BRIEF DESCRIPTION OF THE DRAWINGS

FIG. 1(a) shows the intended composition profile of an AlGaInP GRIN-SCH quaternary alloy laser and FIG. 1(b) is a sputter Auger electron spectroscopy (AES) profile illustrating the graded-index separate confinement heterostructure (GRIN-SCH).

DETAILED DESCRIPTION OF THE INVENTION

Figure 1A:
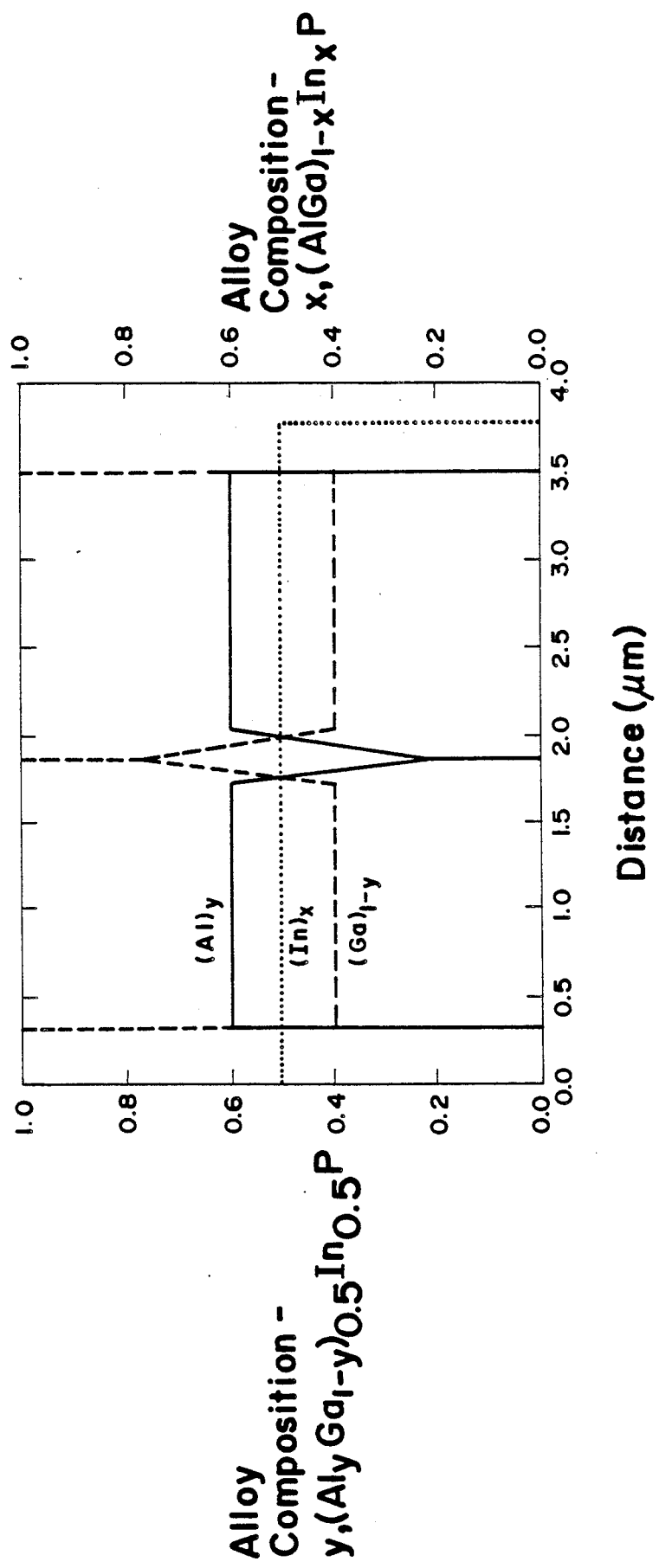

The present invention relates to high power results for both DH and GRIN-SCH laser structures obtained using AlGaInP structures having a single quantum well (QW) active region and graded-index separate optical confinement heterostructure. By high power is meant power greater than 50 milliwatts and in the range up to about 5 watts. The term graded index separate optical confinement heterostructure relates to the linearly or parabolically graded composition surrounding the quantum well which helps to provide the optical mode confinement in the laser. The laser of the present invention represents the first laser to use a graded quaternary alloy.

The epitaxial layers were prepared by low-pressure (76 Torr) organometallic vapor phase epitaxy (OMVPE) using trimethyl metals and phosphine. The substrates used were Zn-doped (100) GaAs and growth begins at 650° C. with a 2500-Å Zn-doped ($p \sim 5 \times 10^{18}$ cm$^{-3}$) $Ga_{0.5}In_{0.5}P$ buffer layer. The growth temperature is then raised to 700° C. for the remainder of the structure, consisting of a 1.5-μm Zn-doped ($p \sim 1 \times 10^{18}$ cm$^{-3}$) $(Al_{0.6}Ga_{0.4})_{0.5}In_{0.5}P$ p-cladding, 1600 Å undoped graded index regions where the composition is linearly graded from $(Al_{0.6}Ga_{0.4})_{0.5}In_{0.5}P$ to $(Al_{0.2}Ga_{0.8})_{0.5}In_{0.5}P$ surrounding the 100 Å $Ga_{0.5}In_{0.5}P$ quantum well, 1.5-μm Te-doped ($n \sim 2 \times 10^{18}$ cm$^{-3}$) $(Al_{0.6}Ga_{0.4})In_{0.5}P$ n-cladding layer, and finally a 2000 Å Te-doped ($n \sim 5 \times 10^{18}$ cm$^{-3}$) $Ga_{0.5}In_{0.5}P$ capping layer. The cladding layers and graded regions are grown at a rate of 400 Å/min and V/III ratio of 300: the $Ga_{0.5}In_{0.5}P$ quantum well, buffer, and cap are grown at 200 Å/min and V/III=600. A 30-s growth stop is provided at the quantum well interfaces.

For comparison purposes, DH lasrs were grown under similar conditions with either a 1500 Å or a 1000 Å $Ga_{0.5}In_{0.5}P$ active region grown at 650° C. and similar cladding layers. Ideally, cladding layers of $Al_{0.5}In_{0.5}P$ should be used for optimum optical confinement. However, zinc acceptor activation in $Al_{0.5}In_{0.5}P$ was found to be very low, so that low-resistivity layers of p-type $Al_{0.5}In_{0.5}P$ could not be grown. This is due to the high ($\sim 125$ meV) acceptor binding energy of zinc in $Al_{0.5}In_{0.5}P$ as shown by Masumi Honda et al, *Jpn. J. Appl. Phys.*, 24:L187 (1987), thus necessitating the use of quaternary p-cladding layers. Alternatively, p-type doping with magnesium has been shown to produce $Al_{0.5}In_{0.5}P$ layers of sufficiently low resistivity for use as laser cladding regions (of M. Ishikawa et al, supra (1986)).

FIG. 1(a) shows the intended layer compositions, while FIG. 1(b) is a sputter Auger electron spectroscopy (AES) profile illustrating the graded-index separate confinement heterostructure (GRIN-SCH). Although there is insufficient resolution to see the quantum well, this profile shows how the alloy composition y in $(Al_yGa_{1-y})_{0.5}P$ is 0.2 at the quantum well interfaces and graded up to y=0.6 for the cladding layers. Lattice-matched quaternaries are obtained by a linear interpolation between the group III organometallic flows that produce the lattice-matched ternaries $Ga_{0.5}In_{0.5}P$ and $Al_{0.5}In_{0.5}P$. The graded regions are formed at a growth rate of 400 Å/min by keeping a constant trimethylindium flow, and appropriately ramping the trimethylgallium and trimethylaluminum flows so as to maintain the lattice match. Lasers are fabricated by wet etching of 80 μm mesa stripes, evaporation and alloying AeGe ohmic metal stripes on top of the mesa, thinning to 100 μm, depositing and alloying Ti-Pt-Au substrate ohmic metal, and cleaving into bars of various lengths (see inset of FIG. 2).

Figure 2:
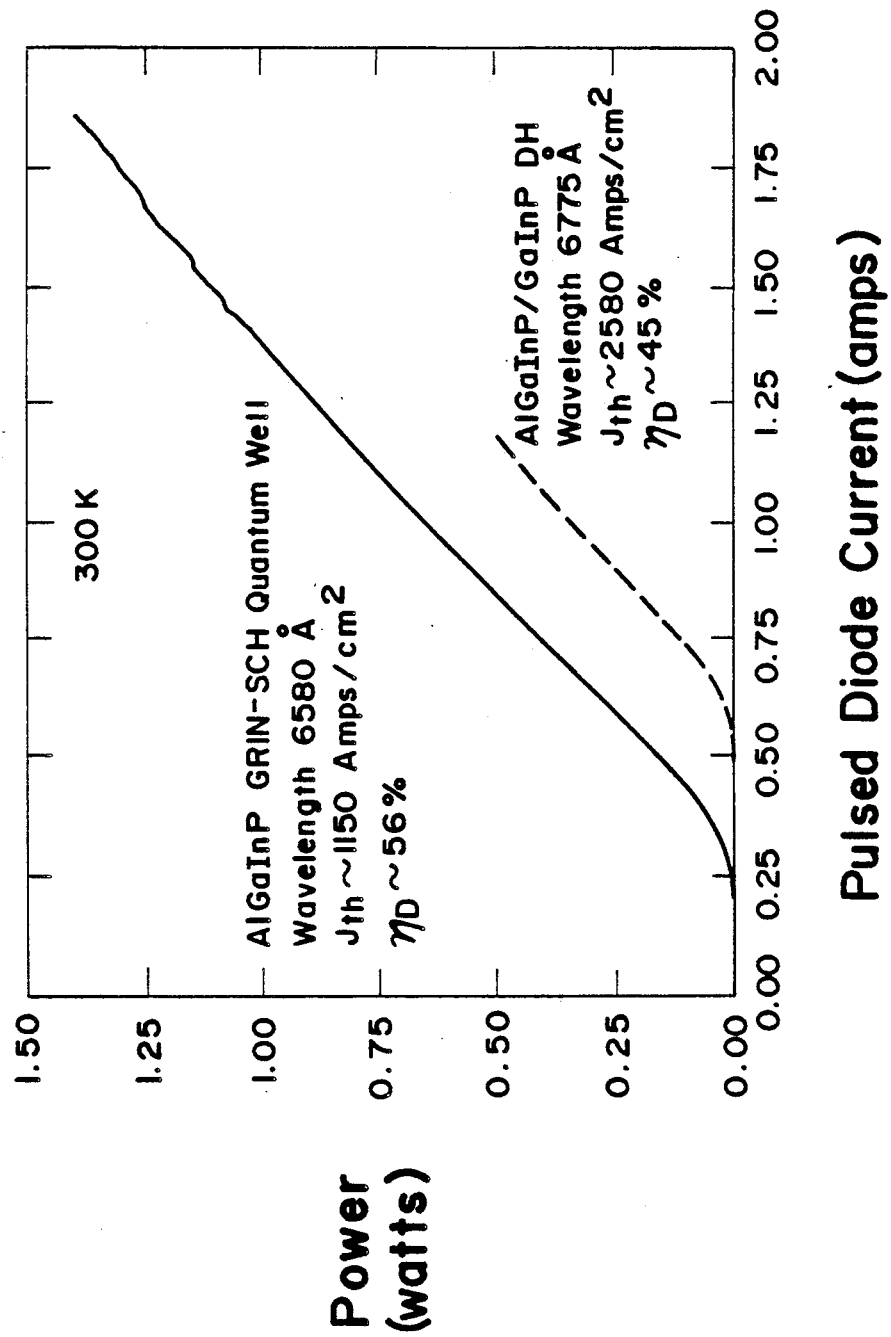
FIG. 2 is a plot of the doubled ended power output (watts) versus pulsed diode current (amps)—200 ms pulse, 1 kH₃ repitition rate—for 80 μm wide×300 μm long GRIN-SCH and DH (double heterostructure) lasers.

For a cavity length of 300 μm. FIG. 2 shows the double-ended power output verus pulsed diode current (200 ns pulse, 1 kHz repetition rate) of the GRIN-SCH laser compared to the best DH laser. The invention relates to both improved GRIN-SCH and improved double heterostructures and lasers fabricated therefrom. For both GRIN-SCH and DH marked improvement of the threshold values, approximately 20% less than the average thresholds, were achieved. For GRIN-SCH lasers the threshold values range from about 0.4 to about 2 kA/cm$^2$ preferrably about 1 kA/cm$^2$. This represents a reduction of approximately a factor of 2 over the DH lasers which show improved ranges of from about 0.5 to about 1.0-2.0. Very high powers ranging from up to at least about 1.4 W were obtained for the GRIN-SCH and up to at least about 0.5 W pulsed power for the DH lasers. Although the lasers are stable when pulsed, continuous operatio of these broad-area devices was not obtained at 300 K. The differential quantum efficiency of the GRIN-SCH laser is also increased to about $\sim 56\%$, and increased to about $\sim 45\%$ for the DH laser.

Figure 3:
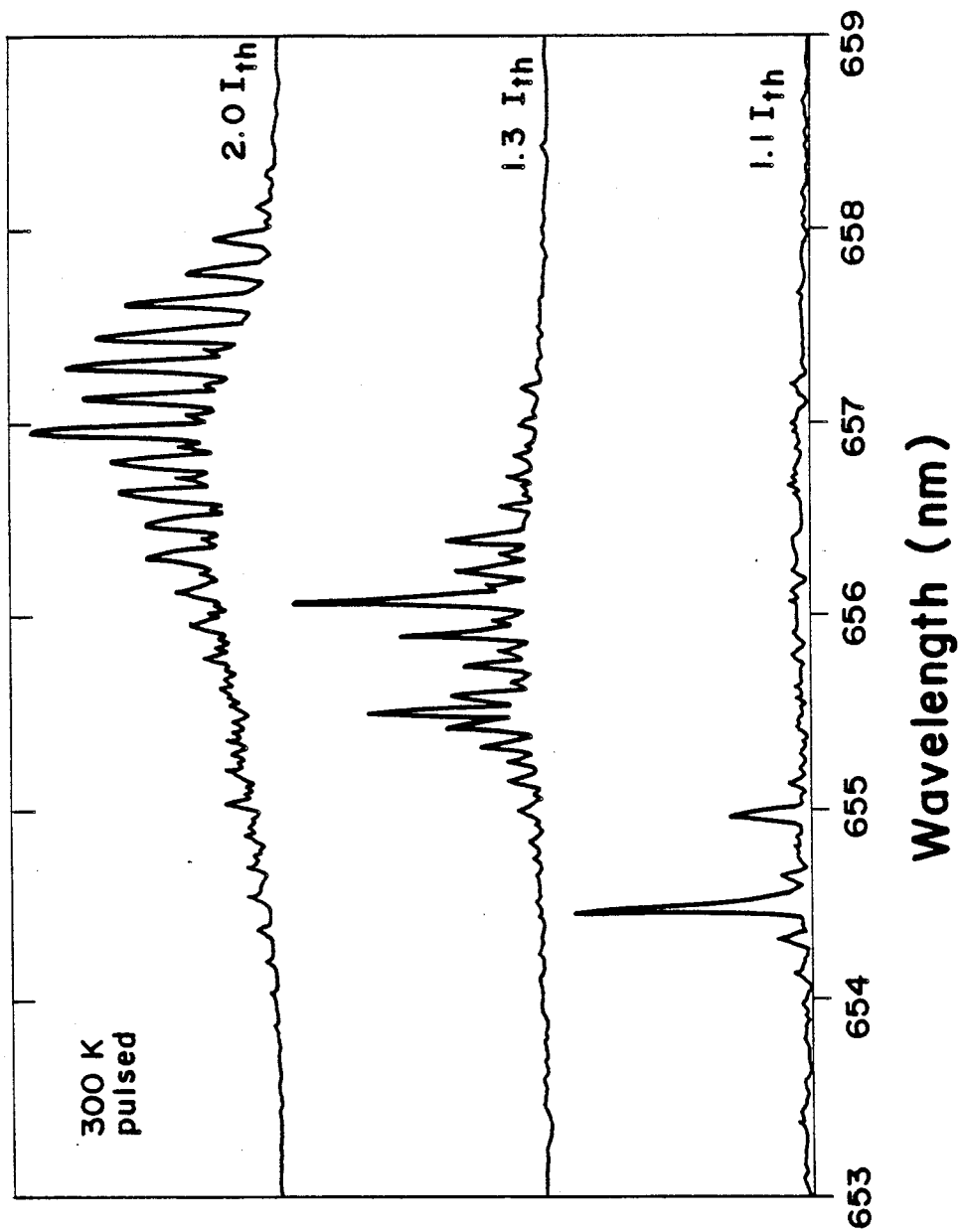
FIG. 3 is a pulsed spectra of GRIN-SCH laser at various driving currents.

Gated (10 ns) spectra of the GRIN-SCH laser under pulsed operation are shown in FIG. 3 for various driving currents. Near threshold, few modes are lasing, while at higher powers several families of Fabry-Perot modes are lasing. The mulimode behavior at high power is accompanied by an increased in the far-field angle. At threshold, a far-field angle of approximately 2° is measured, and is observed to increase with driving current.

Lasing wavelength of the DH is $\sim 678$ nm while that of GRIN-SCH is $\sim 658$ nm. The difference is attributable to both the quantum shift and the different band gaps of the DH active layer (grown at 650° C.) and the GRIN-SCH quantum well active layer (grown at 700° C.). For the OMVPE apparatus used here, lattice-matching band-gap energies of $Ga_{0.5}In_{0.5}P$ epilayers depend on growth temperature, due to an ordered state occurring for $Ga_{0.5}In_{0.5}P$ grown at lower temperatures (A. Gomyo et al, *Appl. Phys. Lett.*, 50:673 (1987)). Preliminary results show a Ga-In layering on (111) planes. The ordering occurs for growth at or below 650° C., and reduces the band gap of lattice-matched $Ga_{0.5}In_{0.5}P$ epilayers. It is estimated that up to 45 meV of the energy difference between the GRIN-SCH and DH could be due to this effect. Experiments are under way to determine if an ordered $Ga_{0.5}In_{0.5}P$ quantum well leads to improved laser performance.

The GRIN-SCH laser threshold current densities and quantum efficiencies are listed for several cavity lengths in Table I. The threshold current density ($J_{th}$) remains relatively unchanged at $\sim 1200$ A/cm$^2$ for cavity lengths between 300 and 860 μm. There is no sign of an increase in $J_{th}$ for the short bars (larger mirror loss), thus indicating that the quantum well gain (n=1, heavy hole) has not saturated with injected carrier density in these structures. In similar AlGaAs structures, devices requiring sufficiently high gain have operated at the n=2 heavy-hole transition of the quantum well. Coincident with this shorter wavelength operation is a loss in diode performance from high carrier density effects, which are believed to be either Auger recombination (N. K. Dutta, *J. Appl. Phys.*, 54.1236 (1983))

| Differential quantum efficiencies ($\eta_d$) for several cavity lengths (L) | | |
|---|---|---|
| L(μm) | $J_{th}$(A/cm$^2$) | $\eta d$ |
| 300 | 1160 | 0.56 |
| 400 | 1150 | — |

-continued

Differential quantum efficiencies ($\eta_d$) for several cavity lengths (L)

| L($\mu$m) | $J_{th}$(A/cm$^2$) | $\eta_d$ |
|---|---|---|
| 530 | 1220 | 0.30 |
| 630 | 1040 | 0.22 |
| 860 | 1350 | 0.19 | or population of quantum states associated with the GRIN layers (J. Nagle et al, *Appl. Phys. Lett.*, 50:1325 (1986)). In this case, electron confinement of the (Al$_{0.2}$Ga$_{0.8}$)$_{0.5}$In$_{0.5}$P/Ga$_{0.5}$PQW heterostructure is somewhat poorer ($\Delta E \sim 50$ meV) than can be achieved with AlGaAs/GaAs structures (%~830 nm). This places a limit on the injected carrier density in the QW which can be achieved without population of other quantum states (n=2) or GRIN states. Apparetnly, even in the shortest devices tested here (300-$\mu$m) no increase in threshold current density occures from effects related to electron confinement to the ground state, thus suggesting that thinner quantum well active regions may be used to further reduce the threshold current density. There is a decrease in differential quantum efficiency ($\eta_d$) for longer bars, due to the distributed cavity loss which includes contribuitons from scattering losses due to the poor surface quality of these layers and from free-carrier absorption. A significant component of the waveguide scattering loss is thought to arise form the n-cladding layer, due to rough surfaces which result when the quaternary material is doped with tellurium.

Figure 4:
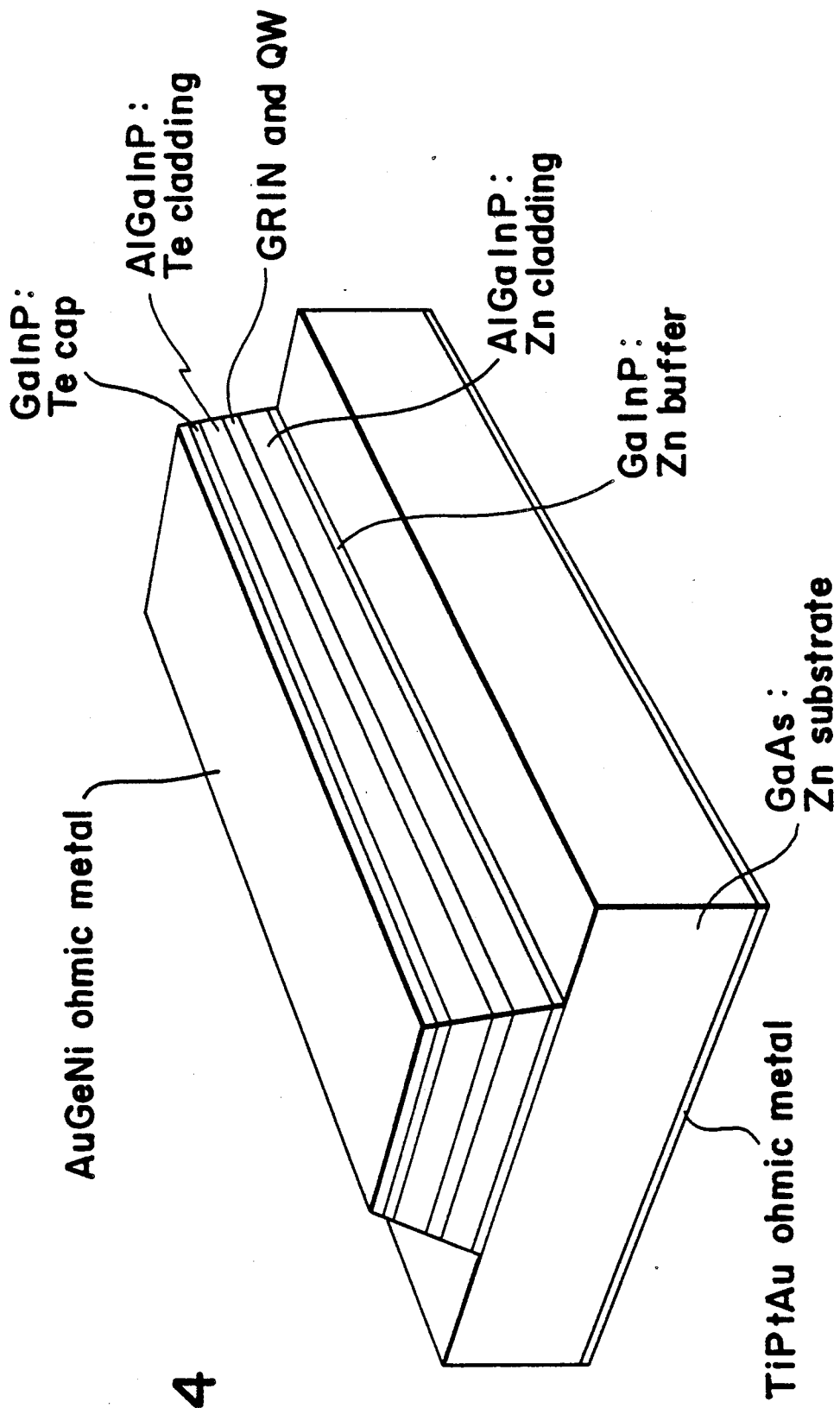
FIG. 4 is a schematic showing the relative positions of the various layers of the single quantum well graded index visible laser.

Useful structures for the improved lasers of the present invention are shown in FIG. 4. GaAs substrates, especially p-doped GaAs, are preferred although other substrates such as n-type, GaAs can be used. Especially preferred are Zn-doped (100) GaAs. The substrate thickness can vary widely with preferred thickness being in the range of from about 5 to about 30 mils.

Referring next to the single quantum well, these are terniary alloys and lattice matched quaternary alloys. Preferred single wells are GaInP ternaries such as Ga$_x$In$_{1-x}$P where X has a value greater than 0 but less than 1, preferrably where X has a value of 0.3 to 0.7 and most preferrably where X is 0.5 (Ga$_{0.5}$In$_{0.5}$P). The thickness of the active region may vary depending on the system composition and the type of devise desired. Typical thicknesses range from about 40 to about 200 Å, with preferred thickness of about 100 Å.

Also useful for this purpose is a lattice-matched quaternary allowy such as (Al$_x$Ga$_{1-x}$)$_{0.5}$In$_{0.5}$P where x has a value from about 0 to about 0.3.

Another important aspect of the invention are the graded regions which are located on both sides of the quantum well and interface therewith. Quaternary alloys having a structure such as for example (Al$_y$Ga$_{1-y}$)$_x$In$_{1-x}$P, and In$_{.53}$Ga$_{0.47}$As quantum well with graded regions In$_{(1-x)}$Ga$_x$As$_y$P$_{(1-y)}$ where x is about 0.47×4, and the like are useful for graded index regions. Preferred quaternary alloys are (Al$_y$Ga$_{1-y}$)$_x$In$_{(1-x)}$P where y has a value from about 0.2 to 0.6 and x has a value from about 0.4 to 0.6. Most preferred AlGaInP quaternaries are those where y is 0.2 to 1.0 and x has a value of 0.5.

A p-doped Ga$_x$In$_{(1-x)}$P buffer layer can be positioned between the substrate and the p-cladding layer (see FIG. 4). Doping of Ga$_{0.5}$In$_{0.5}$P with Zn, Mg, Be or Al is suitable for this purpose. Buffer layers are deposited in thicknesses from about 2000 to about 10,000 Å. A preferred layer is 2500 Å Zn-doped Ga$_{0.5}$In$_{0.5}$P.

A p-cladding layer (quaternary) is next interposed between the buffer and the GRIN-SCH layer. These layers are typically quite small, typically from about 0.7 to about 2.0 $\mu$m and most preferrably about 1.5 $\mu$m. A preferred p-cladding layer is Zn-doped (Al$_{0.6}$Ga$_{0.4}$)$_{0.5}$In$_{0.5}$P.

In a similar fashion, when indicated, a n-cladding layer is interposed the top graded index region and a capping layer. The n-doped cladding layer is similar to the p-cladding layer comprising quaternary compositions such as (Al$_x$Ag$_{1-x}$)$_{0.5}$In$_{0.5}$P where x is from 0.5 up to but not exceeding 1.0. Doping may be accomplished, for example with Te, Si and Se. A preferred n-cladding layer is Se-doped (n~5×10$^{18}$cm$^3$) Ga$_{0.5}$In$_{0.5}$P having a thickness of from about 0.7 to about 2.0 $\mu$m and preferably 1.5 $\mu$m.

An n-doped ternary such as Ga$_x$In$_x$P, GaAs (binary), or a strained InGaAs terniary, and where x has a value of greater than 0 and less than 1 is used to top the semiconductor structure. A Se or Te-doped (n~5×10$^{18}$cm$^{-3}$) Ga$_{0.5}$In$_{0.5}$P capping layer is preferred.

As shown in the table the differential quantum efficiencies (n$_D$) can vary somewhat depending on the cavity length (L). The table also shows how the current density varies with the cavity length. Typical curent densities range from about 1000 to about 1400 Å/cm$^2$. Current density values of 1040 Å/cm$^2$ was observed for a device having a cavity length of 630 $\mu$m.

One skilled in semiconductor and laser art will appreciate that various substitutions can be made within the context of the invention outlined herein. Accordingly, the invention should not be narrowly contrued.

The above experiment represents the first operation of an AlGaInP GRIN-SCH laser with single active quantum well. These lasers which operate at higher quantum efficiency and lower threshold currents are superior to the double heterostructures (see FIG. 2). This is attributed to the reduced density of states in the single quantum well active region. High pulsed powers of 1.4 W from the GRIN-SCH laser and 0.5 W from the DH laser are available. Cavity length dependence of threshold current density signifies that the gain has not saturated in these structures, and indicates that thinner quantum well active regions may be used to further reduce the threshold current density.

The power of the instant lasers are comparable to large frame ion lasers in use. A particular advantage of the red lasers of the present invention is the reduction in size. The instant red laser is roughly a thousand times more efficient and ten thousand times smaller than currently available lasers.

The laser structures of the present invention will be useful in diodes for diode-pumped solid state applications including compact disk playrs, holographic scanners, optical scanners and the like. The invention should not be construed narrowly. One skilled in the art will appreciate that by modifying the composition of the active region visible lasers of various wavelength will obtain.

What is claimed:

1. A high power AlGaInP single quantum well graded index separate confinement heterostructure which comprises a substrate and a multiplicity of layers deposited thereon comprising (1) a single Ga$_x$In$_x$P quantum well where x has a value from about 0.4 to about 0.6; (2) multiple graded index regions on both sides of the quantum well and (3) cladding layers adjacent to each graded region of the well, said graded region comprising $Al_y(Ga_{1-y})_{0.5}In_{0.5}P$ quaternary alloy; wherein the value of y in the graded region varies from about 0.2 at the quantum well/graded region interface to up to about 0.6 for the cladding layers/graded index regions; said heterostructure having a low broad area threshold current with pulsed thresholds in the range from about 1 to about 2 Amps/cm$^2$ and a differential efficiency of from about 20 to about 60 percent.

2. The heterostructure of claim 1 wherein the single quantum well is $Ga_{0.5}In_{0.5}P$.

3. The heterostructure of claim 2 which comprises:
   (a) a p-doped (100) GaAs substrate;
   (b) a multiplicity of layers deposited on the substrate comprising:
      (1) a 2500 Å Zn-doped $Ga_{0.5}In_{0.5}P$ buffer layer deposited on the substrate;
      (2) a 1.5 μm Zn-doped $(Al_{0.6}Ga_{0.4})_{0.5}In_{0.5}P$ p-cladding layer;
      (3) a 100 Å $Ga_{0.5}In_{0.5}P$ single quantum well;
      (4) a multiplicity of 1600 Å undoped graded index regions having compositions linearly graded from $(Al_{0.6}Ga_{0.4})_{0.5}In_{0.5}P$ to $(Al_{0.2}Ga_{0.8})_{0.5}In_{0.5}P$, said graded regions surrounding said single quantum well;
      (5) a 1.5 μm Te-doped ($n \sim 2 \times 10^{18}cm^{-3}$) $(Al_{0.6}Ga_{0.4})_{0.5}InP$ n-cladding layer; and
      (6) a Te-doped ($n \sim 5 \times 10^{18}cm^{-3}$)$Ga_{0.5}In_{0.5}P$ capping layer.

4. The heterostructure of claim 1 which comprises:
   (a) a p-doped (100) GaAs substrate;
   (b) a multiplicity of layers deposited on the substrate comprising:
      (1) a p-doped $Ga_{0.5}In_{0.5}P$ buffer layer deposited on the substrate having a thickness from about 2000 to about 10000 Å;
      (2) a $(Al_{0.6}Ga_{0.4})_{0.5}In_{0.5}P$ p-cladding layer;
      (3) a $Ga_{0.5}In_{0.5}P$ single quantum well having a thickness from about 40 to about 200 Å;
      (4) a multiplicity of undoped graded index regions having compositions linearly graded from $(Al_{0.6}Ga_{0.4})_{0.5}In_{0.5}P$ to $(Al_{0.2}Ga_{0.8})_{0.5}In_{0.5}P$, said graded regions surrounding said single quantum well;
      (5) a $(Al_{0.6}Ga_{0.4})_{0.5}InP$ n-cladding layer; and
      (6) a n-doped $Ga_{0.5}In_{0.5}P$ capping layer.

5. A semiconductor structure that lases in the visible region of the spectrum ranging from about 650 nm to about 680 nm; wherein said structure comprise:
   (1) a GaAs substrate;
   (2) an active layer comprising a single $Ga_xIn_{(1-x)}P$ quantum well where x is a value greater than zero and less than 1.0; said layer having a thickness from about 40 Å to about 200 Å; said single quantum well located between multiple graded index (GRIN) regions;
   (3) multiple GRIN regions surrounding the quantum well comprising a first undoped GRIN region located on the substrate side of the quantum well and interfacing with a p-cladding layer; and a second undoped GRIN region situated on the opposite side of the quantum well; wherein said GRIN regions comprise lattice-matched quaternary Al-GaInP alloy graded from $(Al_{0.6}Ga_{0.4})_{0.5}In_{0.5}P$ to $(Al_{0.2}Ga_{0.8})_{0.5}In_{0.5}P$;
   (4) cladding layers adjacent to the GRIN regions, comprising a p-cladding layer adjacent to the first index region comprising doped $(Al_{0.6}Ga_{0.4})_{0.5}In_{0.5}P$ and a n-cladding layer adjacent to the second index region comprising dopped $(Al_{0.6}Ga_{0.4})_{0.5}In_{0.5}P$;
   (5) a n-type $Ga_{0.5}In_{0.5}P$ capping layer situated above the p-cladding layer;
   (6) a p-type $Ga_{0.5}In_{0.5}P$ buffer layer situated between the substrate and the p-type cladding layer.

6. The semiconductor structure of claim 5 wherein the layers are deposited epitaxially; substrate (1) and layer (2) are deposited at 650° C. and the remaining layers were deposited at 700° C.; said epitaxial layers were prepared by low pressure organometalic vapor phase epitaxy (OMVPE) using trimethyl metals and phosphine; the cladding layers and graded regions were grown at a rate of about 400 Å/minute with a group V/Group III ratio of about 300; the capping layer was grown at about 200 Å/minute with Group V/Group III ratio about 600.

7. The laser of claim 6 which further comprises An-GeNi ohmic metal stripes on one end of the structure and a Ti-Pt-Au ohmic metal layer on the bottom of the substrate.

8. The laser of claim 6 having a lasing wave length in the range of from about 650 to about 660 nm.

9. The laser of claim 8 having a lasing wavelength of about 658 nm.

10. A high performance visable laser which comprises a Zn-doped (100) GaAs Substrate and a multiplicity of layers deposited on the substrate comprising:
    (a) a Zn-doped $Ga_{0.5}In_{0.5}P$ buffer layer deposited on the substrate;
    (b) a Zn-doped $(Al_yGa_{1-y})_{0.5}In_{0.5}P$ p-cladding layer wherein y has a value from about 0.5 to about 1.0;
    (c) a single-quantum well comprising $Ga_{0.5}In_{0.5}P$;
    (d) a multiplicity of undoped graded index regions having a quaternary composition linearly or parabolically graded from $(Al_{0.6}Ga_{0.4})_{0.5}In_{0.5}P$ to $(Al_{0.2}Ga_{0.8})_{0.5}In_{0.5}P$ wherein said graded index regions are positioned above and below the single quantum well and have a thickness of from about 1000 to about 2000 Å;
    (e) an $(Al_{0.8}Ga_{0.4})_{0.5}In_{0.5}P$ n-cladding layer; and
    (f) a Te-doped $Ga_{0.5}In_{0.5}P$ capping layer.

11. The visible laser of claim 10 having a 2500 Å buffer layer deposited on the substrate beginning at 650° C.; wherein the remaining layers are grown at 700° C., the graded index regions are 1600 Å thick; the quantum well is about 100 Å; the Te-doped n-cladding layer is 1.5 μm; and the Te-doped capping layer is 2000 Å; the cladding layers and graded regions are grown at a rate of 400 Å/minute.

12. The laser of claim 10 wherein a $Al_{0.5}In_{0.5}P$ layer doped with magnesium is used in place of the Zn-doped quaternary cladding layer.

13. A single quantum well short wavelength Al-GaInP GRIN-SCH semiconductor laser having high output power in the 660–680 nm range of the spectrum which comprises:
    (1) a Zn-doped (100) GaAs substrate;
    (2) a 2500 Å Zn-doped $Ga_{0.5}In_{0.5}P$ buffer layer;
    (3) 1.5 μm Zn-doped $(Al_{0.6}Ga_{0.4})_{0.5}In_{0.5}P$ p-cladding layer;
    (4) a first undoped graded index region;
    (5) a single quantum well comprising 100 Å $Ga_{0.5}In_{0.5}P$;
    (6) a second undoped graded index region; said first and second graded index regions being lattice matched quantum comprising 1600 Å multiple regions linearly graded from $(Al_{0.6}Ga_{0.4})_{0.5}In_{0.5}P$ to $(Al_{0.2}Ga_{0.8})_{0.5}In_{0.5}P$, and wherein said regions surround the single quantum well;

(7) a 1.5 μm Te-doped $(Al_{0.6}Ga_{0.4})_{0.5}InP$ n-cladding layer; and (8) a Te-doped $Ga_{0.5}In_{0.5}P$ capping layer.

14. A process for fabricating a high power AlGaInP single quantum well graded index heterostructure of claim 1 which comprises:

(a) providing a p-doped GaAs substrate;

(b) depositing on said substrate a multiplicity of layers comprising:

(1) a p-doped $Ga_xIn_{1-x}P$ buffer layer adjacent to the substrate where x has a value of from about 0.4 to 0.6; said layer having a thickness of from about 2000 Å to about 10,000 Å, preferrably 5000 Å, (2) an $(Al_{0.6}Ga_{0.4})_{0.5}In_{0.5}P$ p-cladding layer;

(3) a $Ga_xIn_{(1-x)}P$ single quantum well where x has a value of from about 0.3 to about 0.7;

(4) undoped graded index regions having compositions linearly graded from $(Al_{0.6}Ga_{0.4})_{0.5}In_{0.5}$ to $(Al_{0.2}Ga_{0.8})_{0.5}In_{0.5}P$, said graded index regions surrounding said single quantum well;

(5) an $(Al_{0.6}Ga_{0.4})_{0.5}InP$ n-cladding layer adjacent to graded index region on the top side of the said single quantum well;

(6) an n-doped $Ga_{0.5}In_{0.5}P$ capping layer.

15. The process of claim 14 wherein the layers are deposited by epitaxial deposition at a temperature of from about 625° C. to about 725° C.

16. A process for fabricating a high power AlGaInP single quantum well graded index heterostructure laser by a process according to claim 14 and by adding a top ohmic layer to the top of the said layered structure adjacent to the n-doped capping layer and by adding a bottom ohmic layer to the bottom of said layered structure on the bottom of said substrate.

17. The process of fabricating the single quantum well graded index heterostructure laser of claim 16 wherein the substrate is Zn-doped (100) GaAs substrate; the buffer layer is a 2500 Å Zn-doped $Ga_{0.5}In_{0.5}P$; the p-cladding layer is a 1.5 μm Zn doped $(Al_{0.6}Ga_{0.4})_{0.5}In_{0.5}P$; the quantum well is an 100 Å $Ga_{0.5}In_{0.5}P$ quantum well; the graded index regions are about 1600 Å thick; the n-cladding layer is 1.5 μm Te-doped $(Al_{0.6}Ga_{0.4})_{0.5}In_{0.5}P$ and the capping layer is 2000 Å Te-doped $Ga_{0.5}In_{0.5}P$.

18. The process of claim 17 wherein the cladding layer and graded index regions are grown at a rate of 400 Å/minutes and at a V/III element of ratio of 300; the $Ga_{0.5}In_{0.5}P$ quantum well, buffer and up are gown at 200 Å/minutes with a V/III ratio of 600.

* * * * *